United States Patent [19]
Donovan

[11] Patent Number: 4,799,659
[45] Date of Patent: Jan. 24, 1989

[54] PIN INSERTION SUPPORT MEMBER FOR CIRCUIT BOARDS

[75] Inventor: Paul G. Donovan, Palm Beach Gardens, Fla.

[73] Assignee: Northern Telecom Limited, Montreal, Canada

[21] Appl. No.: 76,226

[22] Filed: Jul. 22, 1987

[51] Int. Cl.⁴ ............................................. B23Q 3/00
[52] U.S. Cl. .............................. 269/289 R; 29/281.1; 269/903
[58] Field of Search ............... 83/925 CC; 15/159 A, 15/159 R; 269/903, 909, 284 R, 303, 315, 309, 310; 29/281.1

[56] References Cited
U.S. PATENT DOCUMENTS

| | | |
|---|---|---|
| 3,681,835 | 8/1972 | Evans et al. ..................... 269/303 |
| 3,765,289 | 10/1973 | Gerber et al. .................. 83/925 CC |
| 3,815,221 | 6/1974 | Pearl .............................. 83/925 CC |
| 4,007,509 | 2/1977 | Odhner ............................. 15/159 A |
| 4,205,835 | 6/1980 | Gerber ............................ 269/289 R |
| 4,593,804 | 6/1986 | Kinsey et al. ...................... 269/303 |

Primary Examiner—Robert C. Watson
Attorney, Agent, or Firm—Foley & Lardner, Schwartz, Jeffery, Schwaab, Mack, Blumenthal & Evans

[57] ABSTRACT

A support member for supporting circuit boards for the insertion of pins into and through the board has a support surface of upstanding closely packed filaments. In a particular arrangement, a plurality of elongate strips of filament material are mounted in a tray shaped carrier. Locating means, such as retractable pins, can be provided for locating a board relative to the support member.

6 Claims, 3 Drawing Sheets

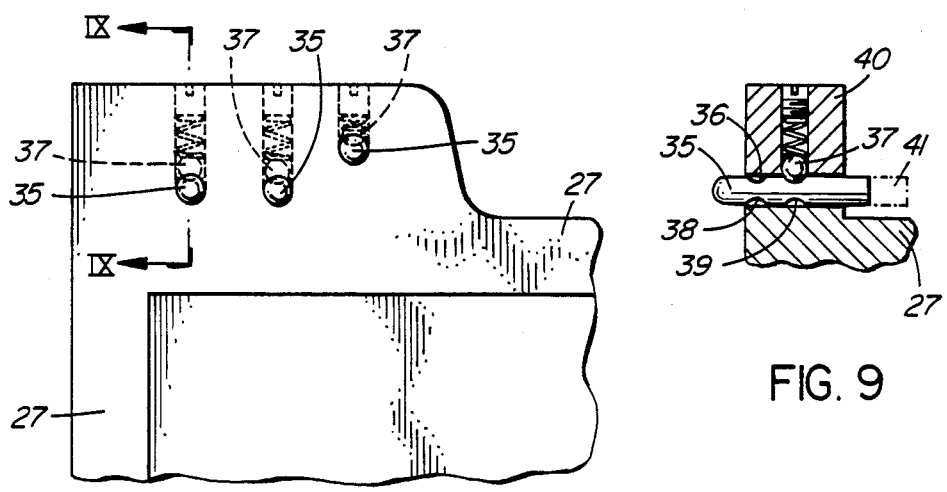
FIG. 8
FIG. 9
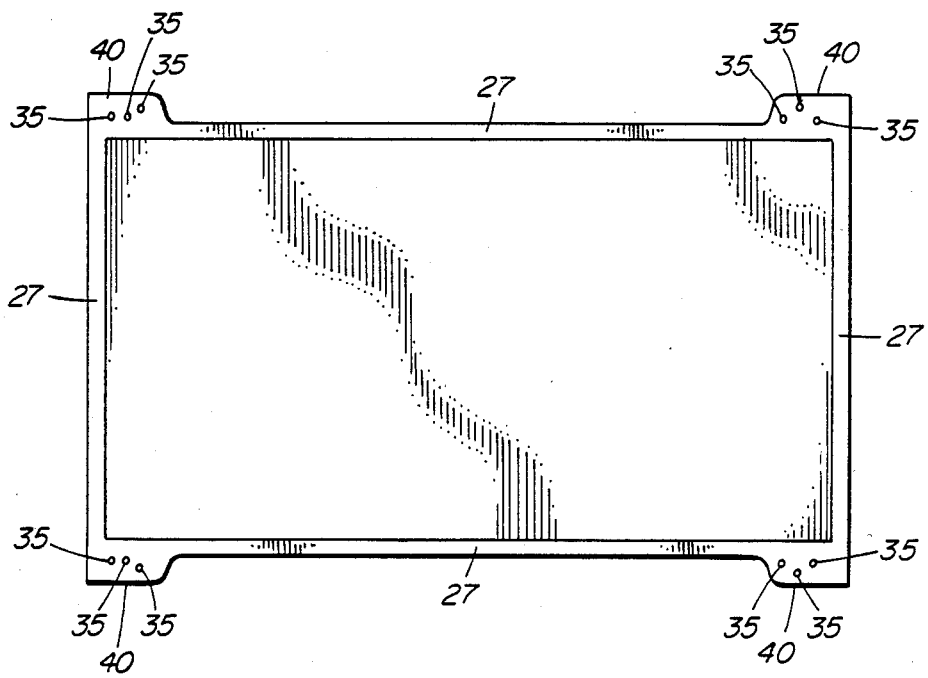
FIG. 10

PIN INSERTION SUPPORT MEMBER FOR CIRCUIT BOARDS

BACKGROUND OF THE INVENTION

1. This invention relates to support members for circuit boards while terminal pins are being inserted. Particularly, the invention relates to large circuit boards such as are used for backplanes in telecommunications systems and other electrical and electronic systems.

2. Related Art

In many systems, smaller circuit boards, connectors, components and other items are mounted on circuit boards by the use of female terminals which connect with terminals pins in the main or large circuit board. Very often a large number of such terminal pins are inserted into a circuit board, and the actual pattern of the pins can vary according to the particular use of the board. Many of the pins will extend in rows across the board. Other pins may be in a random pattern. The pitch of the pins in a row, the spacing of the rows and the random pattern are all subject to variation. As the pins extend through the board, with a part of each pin extending on each side of the board, it is necessary to support the circuit board in such a manner that while firm support is provided, there is an opening in the support member into which a pin can enter on insertion. For pins in rows, a series of grooves can be cut in a support member. Different support members with differing spacing of grooves will be required, depending on the spacing of the rows. However, this is an inconvenience which can be accepted, although the problem of constantly changing support members to handle different boards is a nuisance, and can be dangerous if a mistake is made in selecting the support member. Very large numbers of backplane circuit boards are manufactured and the variety of circuit boards is also very large.

For the random pattern of pins, it is very difficult to cut grooves as they can overlap each other and result in a weak support member. Therefore, individual holes are often drilled into the support member to match the random pattern. This, again, gives rise to the possibility of the wrong support member being selected, as a different support member is required for each board design. A further complication is that in many instances the board has to be turned over for a repeat pin insertion step. This can require a further support member.

SUMMARY OF THE INVENTION

The present invention provides a support member which has a support surface composed of upstanding, closely packed filaments. A typical example of a filament is a bristle or fiber of natural, synthetic or metallic material. These are relatively rigid but easily deflected. They may be tapered and are extremely firm when pressed upon over an area.

One support member will accommodate a variety of boards with differing pin patterns. Locating means are normally provided for locating a circuit board relative to a datum, to enable automated pin insertion to be used.

BRIEF DESCRIPTION OF THE DRAWINGS

The invention will be readily understood by the following description, in conjunction with the accompanying drawings, in which:

FIG. 8 is a top plan view of one corner of a carrier illustrating the provision of locating pins;

FIG. 9 is a cross-section on the line IX—IX of FIG. 8, illustrating one arrangement for mounting the locating pins; and FIG. 10 is a top plan view of a carrier, showing locating pins at each corner.

DETAILED DESCRIPTION OF THE EMBODIMENTS

Figure 1:
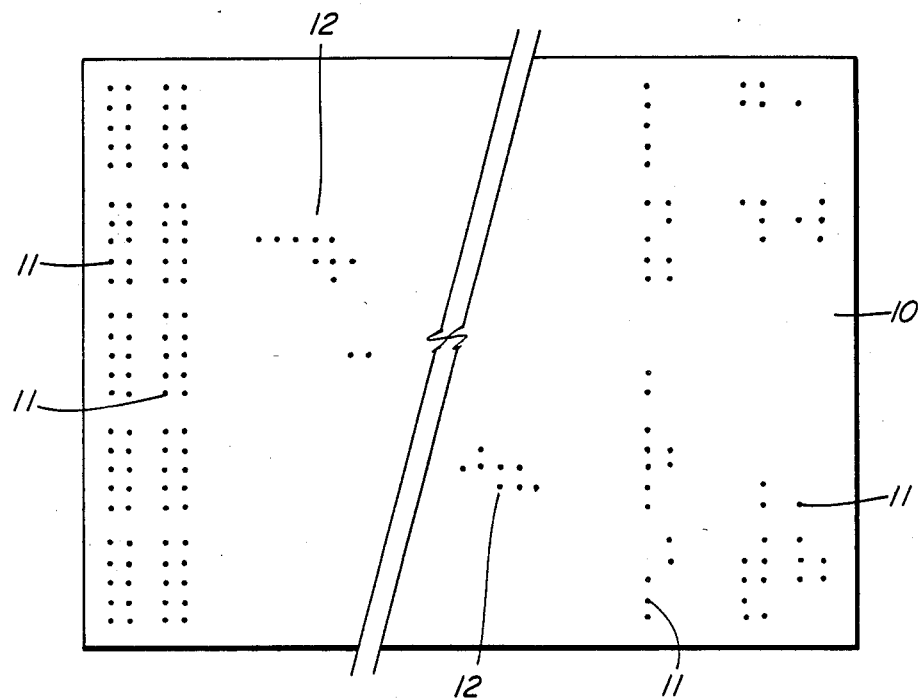
FIG. 1 is a plan view of a circuit board with some terminal pins shown.

FIG. 1 illustrates a circuit board 10 having a large number of terminal pins inserted, in rows at 11 and in a more random pattern at 12. Many more pins are usually inserted than are indicated in FIG. 1. Up to several hundred pins can be required in a backplane circuit board for a telecommunications switching system. A circuit pattern is formed on at least one surface of the circuit board, but is not shown in FIG. 1 because of scale.

Figure 2:
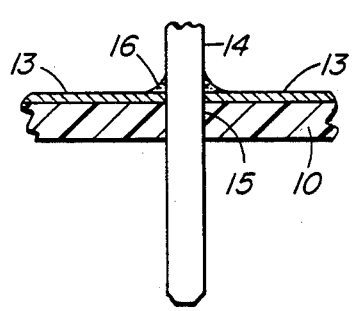
FIG. 2 is a cross-section through a circuit board at a pin position, to a larger scale than in FIG. 1, illustrating a pin in the board.
Figure 3:
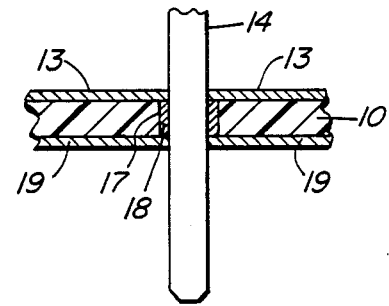
FIG. 3 is a similar cross-section to that of FIG. 2 but with a pin in a plated-through hole.

FIGS. 2 and 3 illustrate a pin as inserted into a circuit board. In FIG. 2, a circuit pattern is shown at 13, pin 14 being a tight fit in the hole 15 in the circuit board 10. The pin may be soldered to the circuit pattern at 16. In FIG. 3, the pin 14 is inserted in a plated-through hole in the circuit board. The hole 17 has a conductive layer 18 formed therein and the pin may be just a tight fit in the hole or may be soldered therein. In this example, in addition to circuit pattern 13 on one surface, a further circuit Pattern 19 is also formed on the other surface.

Figure 4:
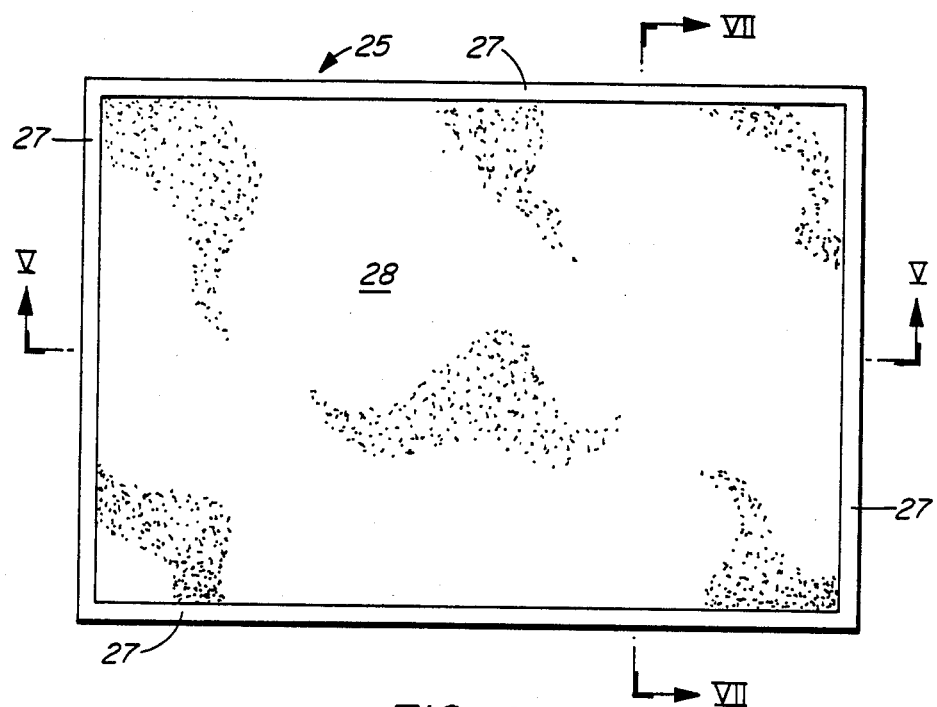
FIG. 4 is a top plan view of one support member in accordance with the invention.
Figure 5:
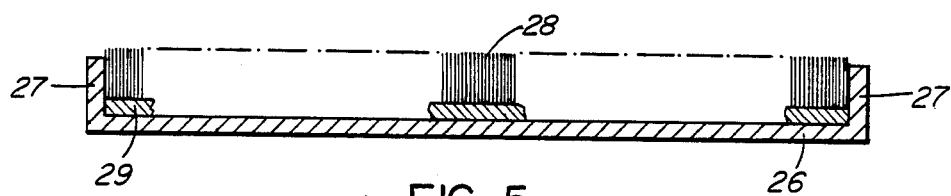
FIG. 5 is a cross-section on the line V—V of FIG. 4.

FIGS. 4 and 5 illustrate one particular form of the Present invention. A support member or carrier 25, in the example being of metal, is in the form of a tray with a bottom surface 26 and walls 27. Positioned in the carrier is a layer of bristle-like or filamentous material 28. In the example, the bristles or filaments 28 are mounted into a backing member 29, which can be of metal, wood or plastic. As an example, brushes such as are used for scouring or scrubbing can be used. However, many of such would be required and the bristle or filamentary material can be obtained in long lengths which can be cut to fit in the carrier. The filaments can be of synthetic material, natural material, metallic material, or combinations thereof.

Figure 6:
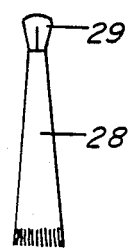
FIG. 6 is an end view of a strip of filaments.
Figure 7:
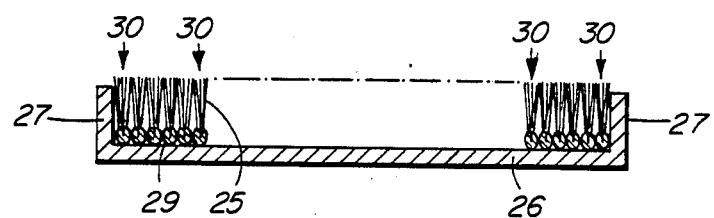
FIG. 7 is a cross-section on the line VII—VII of FIG. 4, illustrating positioning of strips of filaments in a carrier.

FIG. 6 illustrates, in end view, one form of strip filamentary material The filaments 28 are held in the backing member 29. As an example, the backing member 29 is of metal, such as brass, aluminum or steel. Conveniently, the member 29 is formed as a U-shape, the filaments 28 inserted and the member 29 deformed to grip the filaments. In an alternative arrangement, the filaments are bonded into the backing member. In FIG. 7, a plurality of strips of filament material, each strip indicated generally at 30, fill the carrier 25. The strips can be held in the carrier in various ways, for example, by bonding, or by a clamping member at one end which presses on the strips at the one end. Conveniently, the filaments extend a slight distance beyond the height of the walls 27.

While individual filaments are quite flexible, the overall effect of the large area of filament material is to provide a very firm support. Tilting of a circuit board does not occur when inserting pins near an edge of the board. At the same time, the filaments readily deflect to permit passage of a pin into the material as it issues from the board, on insertion.

It will be appreciated that the support member or carrier, with the filament material, will act for any design of pin layout for a circuit board. Therefore, special individually manufactured support members are not required. Also, a board can readily be turned over, after pin insertion, and further pins inserted from the other side.

It is necessary to accurately locate a circuit board while on the support member to enable pin insertion to be carried out. It is possible to mount locating means on the carrier itself, for example on the walls 27, or the support member can be positioned on a machine base which carries locating means.

FIGS. 8, 9 and 10 illustrate one particular locating means. In FIGS. 8 and 9, a series of pins 35 are vertically slideable in holes 36 in a flange 40 on the carrier 25. The pins can each be held in either of two positions by spring loaded balls 37 which engage in grooves 38 and 39 in the pin. A pin is extended above the top surface of the carrier by pushing on the bottom of the pin, the ball 37 moving out of groove 38 and engaging in groove 39. The pins engage in holes in the circuit bord. To retract a pin, it is pushed down with the ball 37 leaving groove 39 and engaging in groove 38. For automated actuation, the pins 35 can be moved by solenoids, fluid pistons and cylinder arrangements, and the like. The movement of pins up and down can then be controlled by a computer to suit the particular board being handled. An extended pin is shown in FIG. 9, while the retracted position is indicated at 41.

FIG. 10 is a top plan view of a carrier 25 with locating pins 35 at each corner. It may not be necessary to have pins at each corner, pins at two corners being sufficient. One series of cooperative pins can be provided at two corners and another series of cooperative pins provided at the other two corners. Pins can also be provided at other positions, instead of or in addition to the corners.

What is claimed is:

1. A support member for pin insertion in circuit boards comprising:
   a carrier having a bottom surface and upstanding side walls;
   a layer of closely packed filaments on said bottom surface within said side walls, said layer extending a short distance above a top surface of said side walls; and
   locating means comprising retractable locating pine mounted in said side walls.

2. A support member as recited in claim 1, including at least one retractable locating pin at each of two corners of said carrier.

3. A support member as recited in claim 1, wherein said layer of closely packed filaments comprises:
   a plurality of strips of filamentary material, each said strip having a plurality of filaments held in an elongate backing member.

4. A support member as recited in claim 1, wherein said retractable locating pins mounted in said side walls have at least one groove for engaging a holding means, the engagement of said groove and holding means setting a position of said locating pin.

5. A support member as recited in claim 4, wherein said holding means comprises a spring loaded ball engaging said groove.

6. A support member for pin insertion in circuit boards comprising:
   a carrier having a bottom surface and upstanding side walls;
   a layer of closely packed filaments on said bottom surface within said side walls, said layer extending a short distance above a top surface of said side walls, said layer being formed of a plurality of strips of filamentary material, each strip having a plurality of filaments held in an elongate backing member; and
   locating means comprising at least one retractable locating pin mounted in said side walls at each of two corners of said carrier, each said locating pin having at least one groove for engaging a holding means for setting a position of said locating pin, each said holding means comprising a spring loaded ball mounted in a said side wall for engaging one of said grooves.

* * * * *